US012387629B2

(12) United States Patent
Ma et al.

(10) Patent No.: US 12,387,629 B2
(45) Date of Patent: Aug. 12, 2025

(54) DISPLAY ASSEMBLY AND ELECTRONIC DEVICE

(71) Applicant: Huawei Technologies Co., Ltd., Shenzhen (CN)

(72) Inventors: Chunjun Ma, Shanghai (CN); Jian Xie, Shanghai (CN); Zhangmin Bao, Shanghai (CN); Yin Li, Shanghai (CN); Bo Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 256 days.

(21) Appl. No.: 17/634,092

(22) PCT Filed: Aug. 4, 2020

(86) PCT No.: PCT/CN2020/106742
§ 371 (c)(1),
(2) Date: Feb. 9, 2022

(87) PCT Pub. No.: WO2021/027620
PCT Pub. Date: Feb. 18, 2021

(65) Prior Publication Data
US 2022/0352483 A1 Nov. 3, 2022

(30) Foreign Application Priority Data
Aug. 9, 2019 (CN) .......................... 201910734168.8

(51) Int. Cl.
*G09F 9/30* (2006.01)
*G06F 1/16* (2006.01)
(Continued)

(52) U.S. Cl.
CPC ............ *G09F 9/301* (2013.01); *G06F 1/1626* (2013.01); *G06F 1/1652* (2013.01);
(Continued)

(58) Field of Classification Search
CPC .. H10K 50/84; H10K 2102/311; H10K 59/87; G06F 1/1626; G06F 1/1652;
(Continued)

(56) References Cited

U.S. PATENT DOCUMENTS 3,966,158 A * 6/1976 Boundy ................. A47B 57/42
248/220.22
5,860,015 A * 1/1999 Olson .................... G06F 1/1632
713/320
(Continued)

FOREIGN PATENT DOCUMENTS

| CN | 204480603 U | 7/2015 |
| CN | 104933964 A | 9/2015 |

(Continued)

*Primary Examiner* — Allen L Parker
*Assistant Examiner* — Keon Kim
(74) *Attorney, Agent, or Firm* — Conley Rose, P.C.

(57) ABSTRACT

A display assembly includes a screen assembly, a rigid cover plate, and a supporting member. The screen assembly includes a flexible display and a flexible cover plate which covers the flexible display. An edge of the flexible display has a first extending part and an arc-shaped outer surface of the first extending part. An edge of the flexible cover plate has a second extending part, an inner surface of the second extending part is an arc-shaped surface, the arc-shaped surface of the outer surface of the first extending part matches the arc-shaped surface of the inner surface of the second extending part, and the second extending part covers the first extending part. An edge of the supporting member has a first side surface that is an arc-shaped surface, the arc-shaped surface of the first side surface matches an arc-shaped surface of an inner surface of the first extending part.

20 Claims, 15 Drawing Sheets

(51) Int. Cl.
  *H04M 1/02* (2006.01)
  *H10K 50/84* (2023.01)
  *H10K 59/80* (2023.01)
  *H10K 102/00* (2023.01)

(52) U.S. Cl.
  CPC .......... *H04M 1/0268* (2013.01); *H10K 50/84* (2023.02); *H10K 59/87* (2023.02); *H10K 2102/311* (2023.02)

(58) Field of Classification Search
  CPC .... G06F 1/1616; G06F 1/1656; G06F 1/1681; H04M 1/0268; G09F 9/301
  See application file for complete search history.

(56) References Cited

U.S. PATENT DOCUMENTS

| | | | | |
|---|---|---|---|---|
| 6,111,760 | A * | 8/2000 | Nixon | H05K 5/0013 361/752 |
| 7,210,963 | B2 * | 5/2007 | Chintala | H04M 1/0252 361/679.01 |
| 9,516,743 | B2 * | 12/2016 | Kim | H10K 77/111 |
| 2014/0139984 | A1 * | 5/2014 | Jung | G06F 1/1601 361/679.01 |
| 2015/0331444 | A1 * | 11/2015 | Rappoport | G06F 1/1601 362/249.02 |
| 2015/0334211 | A1 * | 11/2015 | Shin | G06F 1/1637 455/566 |
| 2016/0342231 | A1 * | 11/2016 | Al | H04M 1/0266 |
| 2017/0186400 | A1 | 6/2017 | Song et al. | |
| 2018/0249584 | A1 * | 8/2018 | Kim | G06F 1/1637 |
| 2018/0364760 | A1 * | 12/2018 | Ahn | G06F 3/0412 |

FOREIGN PATENT DOCUMENTS

| | | | | |
|---|---|---|---|---|
| CN | 104935699 | A | 9/2015 | |
| CN | 105161004 | A | 12/2015 | |
| CN | 204945551 | U | 1/2016 | |
| CN | 105374291 | A | 3/2016 | |
| CN | 206301240 | U * | 7/2017 | ............... G06F 1/16 |
| CN | 206863393 | U | 1/2018 | |
| CN | 207529587 | U | 6/2018 | |
| CN | 108648623 | A | 10/2018 | |
| CN | 108766247 | A | 11/2018 | |
| CN | 109428952 | A | 3/2019 | |
| CN | 208922657 | U | 5/2019 | |
| CN | 110035155 | A | 7/2019 | |
| CN | 110444119 | A | 11/2019 | |
| CN | 210489104 | U | 5/2020 | |
| WO | 2015015788 | A1 | 2/2015 | |

* cited by examiner

DISPLAY ASSEMBLY AND ELECTRONIC DEVICE

CROSS-REFERENCE TO RELATED APPLICATIONS

This is a U.S. National Stage of International Patent Application No. PCT/CN2020/106742 filed on Aug. 4, 2020, which claims priority to Chinese Patent Application No. 201910734168.8 filed on Aug. 9, 2019. Both of the aforementioned applications are hereby incorporated by reference in their entireties.

TECHNICAL FIELD

Embodiments of this application relate to the field of electronic apparatuses, and in particular, to a display assembly and an electronic device.

BACKGROUND

With development of flexible display technologies, a flexible display is bendable and flexible compared with a conventional rigid display, and using a flexible display for display has become a development trend of future display devices. Because the flexible display has flexibility, the flexible display may be applied to a plurality of scenarios in a use process. For example, when the flexible display is applied to a full display scenario, an edge of the flexible display is bent, and an arc surface of a supporting member supporting the flexible display is attached to the bent edge of the flexible display, and supports the edge of the flexible display. However, when the flexible display is bent, because the flexible display elastically deforms, and outward tension is generated inside the flexible display, the bent edge of the flexible display may be separated from the arc surface at an attaching location. Therefore, the bent edge of the flexible display cannot be well fixed to the arc surface of the supporting member by using current simple dispensing and backing bonding technologies.

To resolve the foregoing problem, one solution is to cover a rigid cover plate on a surface of the flexible display to fix the bent edge of the flexible display to the arc surface of the supporting member. In this way, a screen of a display device having the flexible display is merely equivalent to a rigid display. Another solution is to directly use a planar flexible cover plate. If the flexible display is in a planar display state, the flexible cover plate is fixed to the flexible display in a planar manner, and the flexible display is in a planar unfolded state without internal stress. However, a screen-to-body ratio of this design is relatively small.

SUMMARY

Embodiments of this application provide a display assembly and an electronic device, to implement arc surface fixation between a flexible cover plate and a flexible display, thereby increasing a screen-to-body ratio.

According to a first aspect, an embodiment of this application provides a display assembly, including a screen assembly, a rigid cover plate, and a supporting member, where
  the screen assembly includes a flexible display and a flexible cover plate, and the flexible cover plate covers the flexible display;
  the supporting member is configured to support the flexible display;
  an edge of the flexible display has a first extending part, and an outer surface of the first extending part is an arc-shaped surface;
  an edge of the flexible cover plate has a second extending part, an inner surface of the second extending part is an arc-shaped surface, the arc-shaped surface of the outer surface of the first extending part matches at least one part of the arc-shaped surface of the inner surface of the second extending part, and the second extending part covers the first extending part; and
  an edge of the supporting member has a first side surface that is an arc-shaped surface, the arc-shaped surface of the first side surface matches an arc-shaped surface of an inner surface of the first extending part, the first extending part covers the first side surface, and the rigid cover plate covers at least one part of the second extending part and at least one part of the supporting member. The second extending part presses the first extending part, the rigid cover plate covers the edge of the at least one part of the supporting member, the rigid cover plate covers the at least one part of the second extending part, and the rigid cover plate presses the second extending part. In this way, when an electronic device is in a folded, bent, or another state, reverse elastic force generated by the first extending part of the flexible display is counteracted by the rigid cover plate by using the second extending part, to prevent the screen assembly from detaching from the supporting part due to tension of the flexible display. When the first extending part of the flexible display is attached to the first side surface that is in a bent state, the first extending part of the flexible display is protected, to prevent the flexible display from hunching up due to a reason such as bending or folding. The first extending part can perform arc-shaped display, to increase a screen-to-body ratio.

In a possible implementation of the first aspect, the edge of the supporting member further has a second side surface, the second side surface matches at least one part of the inner surface of the second extending part, and the second extending part covers the second side surface. In this way, a distance by which the second extending part extends toward an outer side of the flexible cover plate is greater than a distance by which the first extending part extends toward an outer side of the flexible display, so that the second extending part can effectively tightly press the first extending part.

In a possible implementation of the first aspect, the second side surface is an arc-shaped surface. In this way, the second side surface can be tightly attached to an outer surface of the second extending part in a manner of an arc-shaped surface, so that the second extending part can effectively tightly press the first extending part.

In a possible implementation of the first aspect, a size of a projection of the first extending part onto the supporting member in a Z-axis direction is a first size, a size of a projection of the second extending part onto the supporting member in the Z-axis direction is a second size, and the first size is greater than the second size. In this way, the second extending part can effectively tightly press the first extending part.

In a possible implementation of the first aspect, a projection of the first extending part onto the second extending part abuts against a projection of the rigid cover plate onto the second extending part. In this case, the rigid cover plate does not block the first extending part of the flexible display. The rigid cover plate tightly presses the flexible cover plate and the flexible cover plate tightly presses the flexible display, so that the first extending part of the flexible display is prevented from hunching up or detaching from the supporting part. In addition, a part that is of the first extending part of the flexible display and that is exposed outside through the flexible cover plate is a complete arc surface display, thereby improving user experience.

In a possible implementation of the first aspect, a projection of the first extending part onto the second extending part at least partially overlaps a projection of the rigid cover plate onto the second extending part. When the second extending part has an overlapping part with the rigid cover plate, a compression effect of the rigid cover plate can directly act on the flexible display by using the flexible cover plate, to enhance the compression effect of the rigid cover plate on the second extending part of the flexible display. In addition, when the first extending part of the flexible display performs arc surface display through the flexible cover plate, a user does not see a boundary of the flexible display, so that the electronic device is more aesthetic, and user experience is improved.

In a possible implementation of the first aspect, a projection of the first extending part onto the second extending part is spaced apart from a projection of the rigid cover plate onto the second extending part. In this case, the rigid cover plate does not block the first extending part of the flexible display. The rigid cover plate tightly presses the flexible cover plate and the flexible cover plate tightly presses the flexible display, so that the first extending part of the flexible display is prevented from hunching up or detaching from the supporting part.

In a possible implementation of the first aspect, a contact surface between the rigid cover plate and the supporting member is an arc-shaped surface. In this way, a contact area between the rigid cover plate and the supporting member is increased, so that a connection between the rigid cover plate and the supporting member is stable.

In a possible implementation of the first aspect, at least one part of an inner surface of the rigid cover plate is an arc-shaped surface, the edge of the supporting member further has a third side surface that is an arc-shaped surface, the arc-shaped surface of at least one part of the third side surface matches the arc-shaped surface of the at least one part of the inner surface of the rigid cover plate, and the rigid cover plate covers at least one part of the third side surface; and an outer surface of the second extending part is an arc-shaped surface, the arc-shaped surface of at least one part of the outer surface of the second extending part matches the arc-shaped surface of the at least one part of the inner surface of the rigid cover plate, and the rigid cover plate covers at least one part of the second extending part.

In a possible implementation of the first aspect, the rigid cover plate is fixed relative to both the second extending part and the third side surface.

In a possible implementation of the first aspect, the supporting member further has a first stepped surface, and the first stepped surface is connected to the first side surface and the second side surface.

In a possible implementation of the first aspect, a width of the first stepped surface matches a thickness of the first extending part. In this way, when the first extending part covers the first side surface, the outer surface of the first extending part is smoothly connected to the second side surface.

In a possible implementation of the first aspect, the first stepped surface matches an end surface of the first extending part.

In a possible implementation of the first aspect, the supporting member further has a second stepped surface, and the second stepped surface is connected to the second side surface and the third side surface.

In a possible implementation of the first aspect, a width of the second stepped surface matches a thickness of the second extending part. To be specific, when the second extending part covers the second side surface, the outer surface of the second extending part is located on a same circumference as the third side surface, so that consistency between the second extending part and the third side surface is good.

In a possible implementation of the first aspect, the second stepped surface matches an end surface of the second extending part.

In a possible implementation of the first aspect, an included angle between the second stepped surface and the first stepped surface is greater than 0 degrees.

In a possible implementation of the first aspect, the supporting member has a first stepped surface, at least one part of the first stepped surface matches an end surface of the first extending part, at least one part of the first stepped surface matches an end surface of the second extending part, and a width of the first stepped surface is equal to a sum of a thickness of the first extending part and a thickness of the second extending part. In this way, when the first extending part covers the first side surface, the end surface of the first extending part abuts against the at least one part of the first stepped surface, and when the second extending part covers the first extending part, the end surface of the second extending part abuts against the at least one part of the first stepped surface. The outer surface of the second extending part is located on a same circumference as the third side surface, and the outer surface of the second extending part is smoothly connected to the third side surface, so that consistency between the second extending part and the third side surface is good.

In a possible implementation of the first aspect, a first clamping part is disposed on an inner surface of the rigid cover plate, a second clamping part matching the first clamping part is disposed on the supporting member, and the first clamping part matches and is connected to the second clamping part. In this way, fixation reliability of the rigid cover plate can be enhanced, and an effective compression effect of the rigid cover plate on the flexible cover plate can be ensured.

In a possible implementation of the first aspect, the second extending part and/or the first extending part have/has an avoidance slot, and the avoidance slot is used to avoid the first clamping part or the second clamping part.

In a possible implementation of the first aspect, the rigid cover plate is connected to the supporting member by using a fastener, the rigid cover plate is provided with a first connecting hole, the supporting member is provided with a second connecting hole, and when the rigid cover plate covers at least one part of the supporting member, the second connecting hole is opposite to the first connecting hole, and the fastener sequentially runs through the first connecting hole and the second connecting hole, to connect the rigid cover plate to the supporting member.

In a possible implementation of the first aspect, the rigid cover plate includes at least a first cover plate section and a second cover plate section, the first cover plate section covers at least one part of the second extending part, the second cover plate section covers at least one part of the supporting member, and a thickness of the first cover plate section is less than that of the second cover plate section. The thickness of the rigid cover plate gradually decreases, until an end portion of the rigid cover plate facing toward the flexible cover plate performs transition with the flexible cover plate in a manner of an arc surface. On the basis of ensuring that the first extending part of the flexible display exposes the arc surface screen outside through the flexible cover plate, smooth appearance and good hand holding feelings of the electronic device can be ensured.

According to a second aspect, an embodiment of this application provides an electronic device, including the foregoing display assembly.

The embodiments of this application provide a display assembly and an electronic device. In the display assembly, the second extending part presses the first extending part, the rigid cover plate covers the edge of the at least one part of the supporting member, the rigid cover plate covers the at least one part of the second extending part, and the rigid cover plate presses the second extending part. In this way, when the electronic device is in a folded, bent, or another state, reverse elastic force generated by the first extending part of the flexible display is counteracted by the rigid cover plate by using the second extending part, to prevent the screen assembly from detaching from the supporting part due to tension of the flexible display. When the first extending part of the flexible display is attached to the first side surface that is in a bent state, the first extending part of the flexible display is protected, to prevent the flexible display from hunching up due to a reason such as bending or folding. The first extending part can perform arc-shaped display, to increase a screen-to-body ratio.

DESCRIPTION OF REFERENCE NUMERALS

Figure 1:
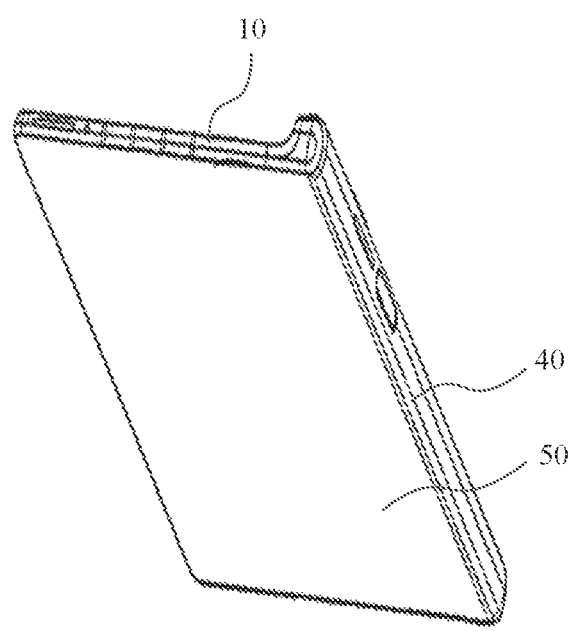
FIG. 1 is a schematic diagram of a structure of a display assembly according to an embodiment of this application.

10—supporting member; 11—connecting edge; 111—first side surface; 112—second side surface; 113—third side surface; 12—second step; 121—second step side wall; 122—second stepped surface; 13—first step; 131—first step side wall; 132—first stepped surface; 14—second connecting hole; 15—second clamping part; 151—guide bevel; 16—avoidance slot;
20—flexible display; 21—first extending part;
30—flexible cover plate; 31—second extending part;
40—rigid cover plate; 41—first clamping part; 411—chamfer; 42—first connecting hole; 43—first cover plate section; 44—second cover plate section;
50—screen assembly; 51—planar display region; 52—arc surface display region;
60—adhesive layer; and
70—rotating shaft.

DESCRIPTION OF EMBODIMENTS

An embodiment of this application provides a display assembly, and the display assembly includes at least a flexible display. The display assembly may be a part of an electronic device, and the electronic device may perform display by using the flexible display. The flexible display is bendable and flexible. Therefore, the electronic device may have one or more use states, and the use state may be a folded state, an unfolded state, a bent state, or the like. For example, the electronic device has an unfolded state, or the electronic device has a bent state, or the electronic device has a bent state and an unfolded state, or the electronic device has a folded state and an unfolded state. When the electronic device is in the folded state, the electronic device has a relatively small size, and the flexible display is in a folded state. When the electronic device is in the unfolded state, the flexible display is in a flat unfolded state. When the electronic device is in the bent state, the flexible display is in a bent state.

The electronic device may be a smartphone, a notebook computer, a tablet computer, a smartwatch, an ebook, a virtual reality (Virtual Reality, VR) device, an augmented reality (Augmented Reality, AR) device, a mixed reality (Mixed Reality, MR), or the like. The electronic device supports installation of various types of desktop applications, and the flexible display may display various desktop applications in an entire-screen or split-screen manner. The desktop applications include but are not limited to a photo application, a browser application, an instant message application, a game application, a video player application, an office automation application, and the like.

A flexible cover plate may be disposed on the flexible display, so that folded, unfolded, bent, and other states of the electronic device can be implemented. If the flexible cover plate is used, a side edge of the flexible display generates reverse elastic force during bending, and effective bonding cannot be implemented between the side edge of the flexible display and an arc-shaped supporting part. Consequently, the flexible display is separated from the supporting part. Therefore, it is necessary to improve a mounting and fixing manner of the flexible display, to implement effective fixation between the flexible display and the arc-shaped supporting part, to increase a screen-to-body ratio, thereby improving hand holding feelings of the electronic device. To achieve the foregoing technical effect, in an embodiment of this application, a rigid cover plate is added based on the flexible cover plate, and the side edge of the flexible display is fixed by using the rigid cover plate, to avoid separation of the flexible display from the supporting part.

The following describes in detail the display assembly provided in this application by using specific embodiments. The following several specific embodiments may be combined with each other. Same or similar content is not described repeatedly in different embodiments.

For ease of description, in the following embodiments, an example in which the electronic device is a smartphone, and the display assembly is applied to the smartphone and is used as a part of the smartphone is used for detailed description. Implementations in which the display assembly is applied to another device are similar, and details are not described herein again in this embodiment.

The following describes in detail an implementation of the display assembly provided in this application with reference to the embodiments.

Figure 2:
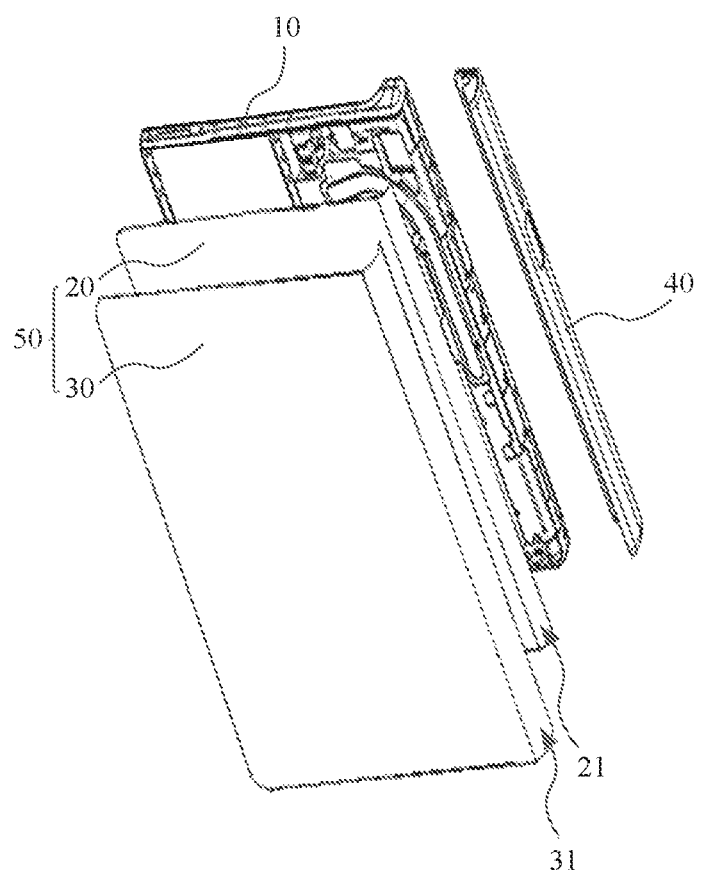
FIG. 2 is a schematic exploded view of a display assembly according to an embodiment of this application.
Figure 3:
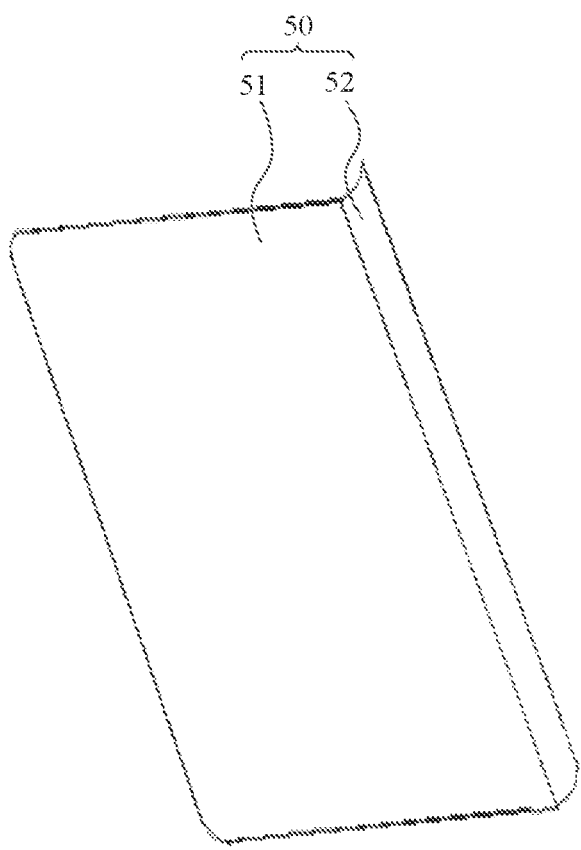
FIG. 3 is a schematic diagram of a structure of a first screen assembly in a display assembly according to an embodiment of this application.
Figure 4:
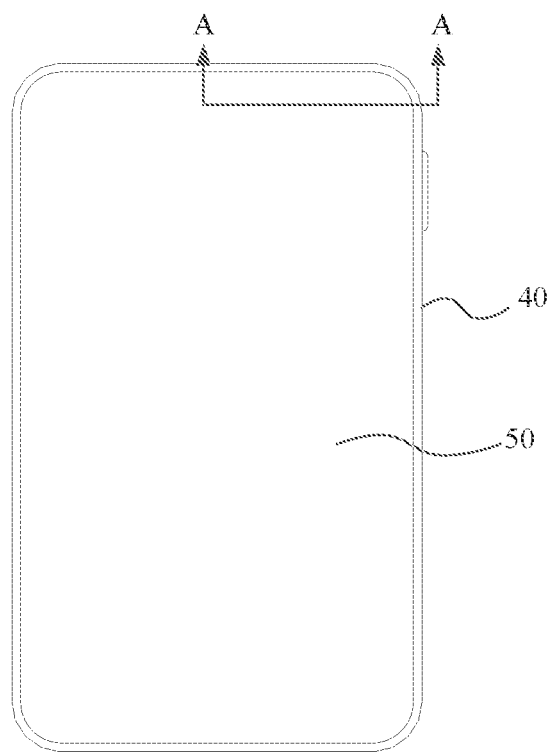
FIG. 4 is a main view of a display assembly according to an embodiment of this application.
Figure 5:
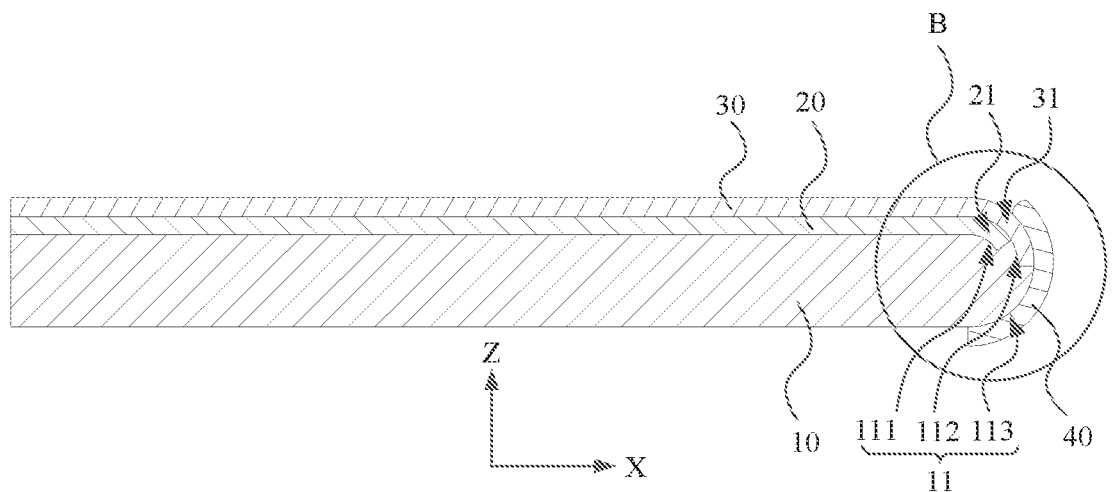
FIG. 5 is a first cross-sectional diagram along A-A in FIG. 4.

FIG. 1 is a schematic diagram of a structure of a display assembly according to an embodiment of this application; FIG. 2 is a schematic exploded view of a display assembly according to an embodiment of this application; FIG. 3 is a schematic diagram of a structure of a first screen assembly in a display assembly according to an embodiment of this application; FIG. 4 is a main view of a display assembly according to an embodiment of this application; and FIG. 5 is a first cross-sectional diagram along A-A in FIG. 4. It should be noted that the accompanying drawings in the embodiments of this application are merely examples, and the display assembly in this application is not limited to being applied to an electronic device. Refer to FIG. 1 to FIG. 5. The display assembly provided in this embodiment includes a screen assembly 50, a rigid cover plate 40, and a supporting member 10. The screen assembly 50 is located on the supporting member 10, and the rigid cover plate 40 is connected to the screen assembly 50 and the supporting member 10.

Refer to FIG. 3. The screen assembly 50 may provide a planar display region 51 and an arc surface display region 52. The planar display region 51 is a main display region of the electronic device. The arc surface display region 52 is located on an edge of the planar display region 51, and can provide arc surface display, which may also be understood as curved surface display. The arc surface display region 52 enlarges a display region of the electronic device, so that the electronic device can perform arc surface display on the basis of planar display, to increase a screen-to-body ratio. The screen-to-body ratio is a relative ratio of a projection of an area of a screen to a projection of an area of a front panel of the mobile phone in a front direction.

Refer to FIG. 2 and FIG. 5. The screen assembly 50 includes a flexible display 20 and a flexible cover plate 30 covering the flexible display 20. The flexible display 20 may be, for example, an organic light-emitting diode (organic light-emitting diode, OLED) display. At least one part of an edge of the flexible display 20 has a first extending part 21 extending toward an outer side of the flexible display 20. The first extending part 21 is arc surface shaped. The first extending part 21 also has a display function the same as that of the flexible display 20. The first extending part 21 can provide arc surface display. That is, the flexible display 20 corresponds to the planar display region 51 in FIG. 3, and the first extending part 21 corresponds to the arc surface display region 52 in FIG. 3.

A quantity and locations of the first extending parts 21 of the flexible display 20 may be determined based on a display requirement of the electronic device. For example, when one side of the electronic device performs arc surface display, the flexible display 20 has one first extending part 21, for example, as shown in FIG. 1. Alternatively, when two opposite sides of the electronic device perform arc surface display, one first extending part 21 exists on an edge of each of two opposite sides of the supporting member 10. The quantity and locations of the first extending parts 21 of the flexible display 20 are not particularly limited in this embodiment.

The flexible cover plate 30 covers the flexible display 20. The flexible cover plate 30 is a flexible, bendable, and transparent cover plate. The flexible cover plate 30 may be made of, for example, a material having high surface hardness and high light transmittance, such as polyterephthalic acid or polyimide.

The flexible cover plate 30 has functions in a plurality of aspects. For example, the flexible cover plate 30 can protect the flexible display 20 to prevent the flexible display 20 from being damaged by external force, and can also bend together with the flexible display 20, so that the electronic device can be in folded, bent, and other different states.

When the flexible cover plate 30 covers the flexible display 20, the flexible cover plate 30 is connected to the flexible display 20 to be fixed on the flexible display 20, so that the flexible cover plate 30 can bend together with the flexible display 20. For example, a lower surface of the flexible cover plate 30 covers an upper surface of the flexible display 20, and the lower surface of the flexible cover plate 30 may be attached to the upper surface of the flexible display 20 in an adhesive manner. A manner in which the flexible cover plate 30 is attached to the flexible display 20 is not particularly limited in this embodiment.

Because the at least one part of the edge of the flexible display 20 has the first extending part 21 extending outward, to enable the flexible cover plate 30 to fix the first extending part 21 of the flexible display 20, at least one part of an edge of the flexible cover plate 30 has a second extending part 31 extending outward, the second extending part 31 is arc surface shaped, the second extending part 31 covers the first extending part 21, and the first extending part 21 is fixed by using the second extending part 31. Optionally, a lower surface of the second extending part 31 covers an upper surface of the first extending part 21, and the lower surface of the second extending part 31 may be attached to the upper surface of the first extending part 21 in an adhesive manner. A manner in which the second extending part 31 is attached to the first extending part 21 is not particularly limited in this embodiment.

A quantity and locations of the second extending parts 31 may be correspondingly determined based on the quantity and locations of the first extending parts 21. Determining of the quantity and locations of the first extending parts 21 is described above, and details are not described herein again.

Refer to FIG. 2, FIG. 3, and FIG. 5. The supporting member 10 may be a frame constituting the electronic device, and the screen assembly 50 and a rear cover of the electronic device may be respectively connected to two opposite side surfaces of the supporting member 10. The supporting member 10 may alternatively be a middle frame, a frame body, or the like. An edge of the supporting member 10 is at least partially an arc surface shaped connecting edge 11, the connecting edge 11 includes a first side surface 111, and the first side surface 111 is a part of the connecting edge 11. Therefore, the first side surface 111 is also arc surface shaped. A location of the first side surface 111 corresponds to that of the first extending part 21, an inner surface of the first extending part 21 matches an arc-shaped surface of the first side surface 111, and the first extending part 21 covers the first side surface 111, so that the supporting member 10 supports the flexible display 20.

Refer to FIG. 2 and FIG. 5. The rigid cover plate 40 is configured to fix the flexible cover plate 30. The rigid cover plate 40 covers an edge of at least one part of the supporting member 10, and the rigid cover plate 40 also covers at least one part of the second extending part 31, to connect the flexible cover plate 30 to the supporting member 10 by using the rigid cover plate 40.

The rigid cover plate 40 may be used as a part of an appearance of the electronic device, and is directly exposed outside, or a housing may be covered on the outside of the rigid cover plate 40, to hide the rigid cover plate 40, so that the appearance of the electronic device is relatively aesthetic.

The rigid cover plate 40 may be made of one of the following materials; plastic, ceramic, glass, and metal, or two of the materials through compounding. The material used for the rigid cover plate 40 is not particularly limited in this embodiment.

The rigid cover plate 40 may be a transparent cover plate or an opaque cover plate. This may be specifically determined based on a requirement of the electronic device and the selected material.

In the display assembly provided in this embodiment, the second extending part 31 covers the first extending part 21, that is, the second extending part 31 can press the first extending part 21, the rigid cover plate 40 covers the edge of at least one part of the supporting member 10, and the rigid cover plate 40 covers at least one part of the second extending part 31, that is, the rigid cover plate 40 is connected to the supporting member 10, and the rigid cover plate 40 can press the second extending part 31. In this way, when the electronic device is in the folded, bent, or another state, reverse elastic force generated by the first extending part 21 of the flexible display 20 is counteracted by the rigid cover plate 40 by using the second extending part 31, to prevent the screen assembly 50 from detaching from the supporting part due to tension of the flexible display 20. When the first extending part 21 of the flexible display 20 is attached to the first side surface 111 that is in a bent state, the first extending part 21 of the flexible display 20 is protected, to prevent the flexible display 20 from hunching up due to a reason such as bending or folding.

Still refer to FIG. 5. In this embodiment, because the connecting edge 11 is an arc surface shaped edge, the first extending part 21 of the flexible display 20 is in a bent state, to cover the first side surface 111 of the connecting edge 11.

To enable the second extending part 31 to effectively tightly press the first extending part 21, the first extending part 21 and the second extending part 31 may be disposed in the following location setting manners.

Refer to FIG. 5. The connecting edge 11 further includes a second side surface 112, the second side surface 112 may be a plane, the second side surface 112 may also be arc surface shaped, and the arc-shaped surface of the second side surface 112 matches at least one part of an arc-shaped surface of an inner surface of the second extending part 31. To be specific, a distance by which the second extending part 31 extends toward an outer side of the flexible cover plate 30 is greater than a distance by which the first extending part 21 extends toward an outer side of the flexible display 20, the first extending part 21 covers the first side surface 111 of the connecting edge 11, the second extending part 31 covers the second side surface 112 of the connecting edge 11, and the second extending part 31 covers the first extending part 21. A size of a projection of the second extending part 31 onto the supporting member 10 in a Z-axis direction is a first size, a size of a projection of the first extending part 21 onto the supporting member 10 in the Z-axis direction is a second size, the first size is greater than the second size, and the Z-axis direction is a direction perpendicular to a plane of the flexible cover plate 30. A location at which the first extending part 21 covers the connecting edge 11 is different from a location at which the second extending part 31 covers the connecting edge 11.

Optionally, a difference between the first size and the second size may be in a range of 2 millimeters to 5 millimeters. In this way, when the second extending part 31 can effectively tightly press the first extending part 21, the material of the flexible display 20 can be reduced, to reduce costs.

Figure 6:
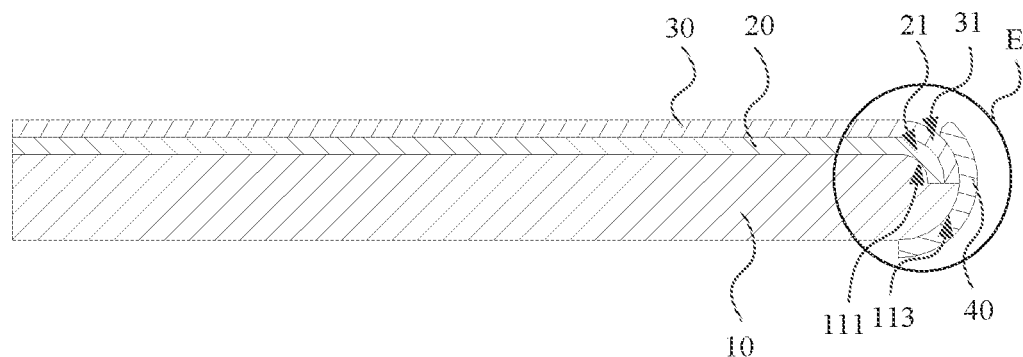
FIG. 6 is a second cross-sectional diagram along A-A in FIG. 4.

FIG. 6 is a second cross-sectional diagram along A-A in FIG. 4. Refer to FIG. 6. An extending distance of the second extending part 31 is equal to that of the first extending part 21. To be specific, only the first extending part 21 covers the first side surface 111 of the connecting edge 11, and the second extending part 31 covers the first extending part 21. In this way, the second extending part 31 can cover the first extending part 21, and the second extending part 31 presses the first extending part 21.

Figure 7:
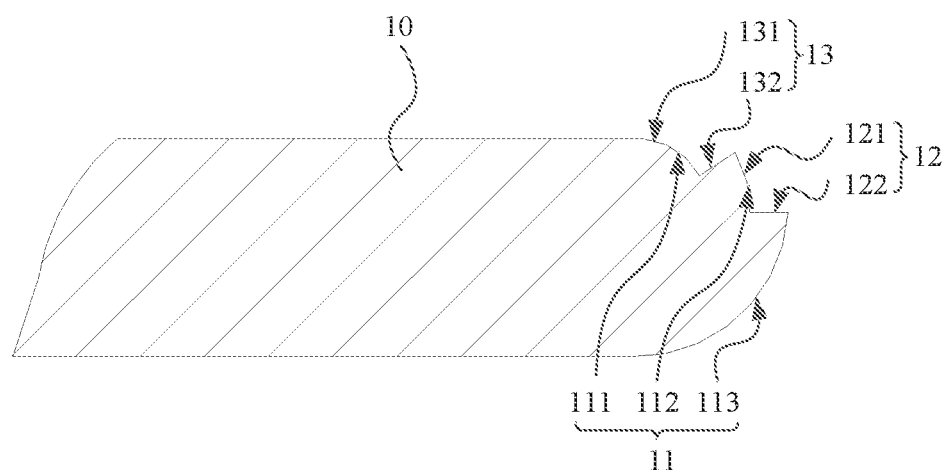
FIG. 7 is a schematic diagram of a local structure of a supporting member in FIG. 5.

FIG. 7 is a schematic diagram of a local structure of a supporting member in FIG. 5. Refer to FIG. 5 and FIG. 7. In this embodiment, at least one part of an inner surface of the rigid cover plate 40 is an arc-shaped surface, the connecting edge 11 further includes a third side surface 113, and the third side surface 113 is an arc-shaped surface. A part of the inner surface of the rigid cover plate 40 matches a part of the third side surface 113 of the connecting edge 11. The other part of the inner surface of the rigid cover plate 40 matches an outer surface of the second extending part 31. In this way, processing of the supporting member 10 and the rigid cover plate 40 is facilitated, and when the third side surface 113 of the connecting edge 11 and the second extending part 31 are connected to the rigid cover plate 40, a part of the inner surface of the rigid cover plate 40 overlaps a part of the third side surface 113 of the connecting edge 11, and the other part of the inner surface of the rigid cover plate 40 overlaps the outer surface of the second extending part 31, to increase a contact area between the third side surface 113 and the rigid cover plate 40 and a contact area between the second extending part 31 and the rigid cover plate 40, so that the rigid cover plate 40 can be more firmly connected to the third side surface 113 and the second extending part 31.

Refer to FIG. 7. An inner surface of the first extending part 21 of the flexible display 20 and an outer surface of the first extending part 21 of the flexible display 20 are arc-shaped surfaces. An inner surface of the second extending part 31 of the flexible cover plate 30 is an arc-shaped surface. A matching region between the second extending part 31 and the rigid cover plate 40 may be a plane or an arc-shaped surface. A matching region between the rigid cover plate 40 and the supporting part 10 may be a plane or an arc-shaped surface. For ease of understanding the solution, the accompanying drawings in this embodiment are all illustrated by using arc-shaped surfaces.

Still refer to FIG. 5 and FIG. 7. In this embodiment, the supporting member 10 further has a first step 13. The first step 13 has a first step side wall 131 and a first stepped surface 132. The first stepped surface 132 of the first step 13 is connected to the first side surface III and the second side surface 112. The first step side wall 131 is the first side surface 111. The first step side wall 131 of the first step 13 is an arc shape that matches the inner surface of the first extending part 21. In this way, a contact area between the first extending part 21 and the first side surface 111 is increased, so that the first extending part 21 can be more firmly connected to the first side surface 111.

A width of the first stepped surface 132 of the first step 13 matches a thickness of the first extending part 21. When the first extending part 21 covers the first side surface 111, the outer surface of the first extending part 21 is located on a same circumference as the second side surface 112, and the outer surface of the first extending part 21 is smoothly connected to the second side surface 112. Optionally, when the first extending part 21 covers the first side surface 111, the first stepped surface 132 of the first step 13 abuts against an end surface of the first extending part 21, and the first stepped surface 132 of the first step 13 matches the end surface of the first extending part 21. The first stepped surface 132 may be a plane, or an arc surface, or an irregular surface. This is not limited herein in this embodiment.

Still refer to FIG. 5 and FIG. 7. In this embodiment, the supporting member 10 further has a second step 12, the second step 12 is disposed adjacent to the first step 13, and the second step 12 has a second step side wall 121 and a second stepped surface 122. The second stepped surface 122 is connected to the second side surface 112 and the third side surface 113, and the second step side wall 121 is the second side surface 112. The second step side wall 121 of the second step 12 is an arc shape that matches the inner surface of the second extending part 31. In this way, the second extending part 31 covers the second step side wall 121, and the second step side wall 121 overlaps the inner surface of the second extending part 31, so that a contact area between the second extending part 31 and the second side surface 112 is increased, and the second extending part 31 can be more firmly connected to the second side surface 112.

A width of the second stepped surface 122 of the second step 12 matches a thickness of the second extending part 31. To be specific, when the second extending part 31 covers the second side surface 112, the outer surface of the second extending part 31 is located on a same circumference as the third side surface 113, and the outer surface of the second extending part 31 is smoothly connected to the third side surface 113, so that consistency between the second extending part 31 and the third side surface 113 is good. Correspondingly, an inner surface of the rigid cover plate 40 matching the outer surface of the second extending part 31 is a continuous arc surface, to facilitate processing the rigid cover plate 40.

Optionally, when the second extending part 31 covers the second side surface 112, the second stepped surface 122 of the second step 12 abuts against an end surface of the second extending part 31, and the second stepped surface 122 of the second step 12 matches the end surface of the second extending part 31. The second stepped surface 122 may be a plane, or an arc surface, or an irregular surface. This is not limited herein in this embodiment.

Optionally, there is an included angle between the first stepped surface 132 and the second stepped surface 122. The included angle between the first stepped surface 132 and the second stepped surface 122 is greater than 0°. The included angle between the first stepped surface 132 and the second stepped surface 122 is determined based on the end surface of the second extending part 31 and the end surface of the first extending part 21. This is not limited herein in this embodiment.

In the embodiment shown in FIG. 5 and FIG. 7, a total of two steps: the second step 12 and the first step 13 are disposed on the connecting edge 11 of the supporting member 10, or one step may be disposed on the connecting edge 11 of the supporting member 10.

Figure 8:
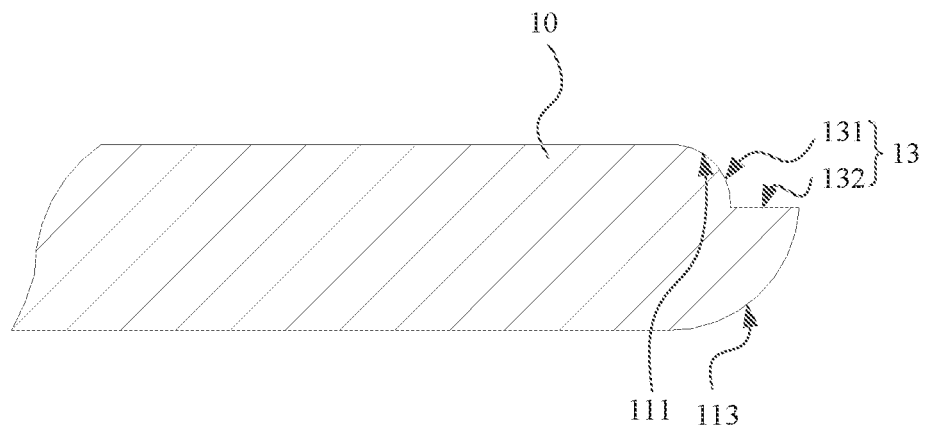
FIG. 8 is a schematic diagram of a local structure of a supporting member in FIG. 6.

FIG. 8 is a schematic diagram of a local structure of a supporting member in FIG. 6. Refer to FIG. 6 and FIG. 8. In this embodiment, the supporting member 10 further has a first step 13. The first step 13 has a first step side wall 131 and a first stepped surface 132. The first stepped surface 132 is connected to the first side surface 111 and the third side surface 113. The first step side wall 131 is an arc shape matching the inner surface of the first extending part 21, and a width of the first stepped surface 132 is equal to a sum of a thickness of the first extending part 21 and a thickness of the second extending part 31. When the first extending part 21 covers the first side surface 111, an end surface of the first extending part 21 abuts against at least one part of the first stepped surface 132, and when the second extending part 31 covers the first extending part 21, an end surface of the second extending part 31 abuts against at least one part of the first stepped surface 132. The outer surface of the second extending part 31 is located on a same circumference as the third side surface 113, and the outer surface of the second extending part 31 is smoothly connected to the third side surface 113, so that consistency between the second extending part 31 and the third side surface 113 is good.

Optionally, the end surface of the first extending part 21 matches a part of the at least one part of the first stepped surface 132, and the end surface of the second extending part 31 matches the other part of the at least one part of the first stepped surface 132. The at least one part of the first stepped surface 132 may be a plane, or an arc surface, or an irregular surface. This is not limited herein in this embodiment.

Still refer to FIG. 5. The rigid cover plate 40 may be a transparent cover plate or an opaque cover plate. For example, when the rigid cover plate 40 is an opaque cover plate, the rigid cover plate 40 covers a part of the second extending part 31, to ensure that the first extending part 21 of the flexible display 20 can perform arc surface display through the second extending part 31 that is not covered by the rigid cover plate 40. However, when the rigid cover plate 40 is a transparent cover plate, the rigid cover plate 40 can cover at least one part of the second extending part 31. In both cases, it can be ensured that the first extending part 21 of the flexible display 20 can perform arc surface display.

Optionally, when the rigid cover plate 40 covers a part of the second extending part 31, locations of the first extending part 21 of the flexible display 20 and the rigid cover plate 40 also have a plurality of implementations, which are described in detail with reference to figures.

Figure 9:
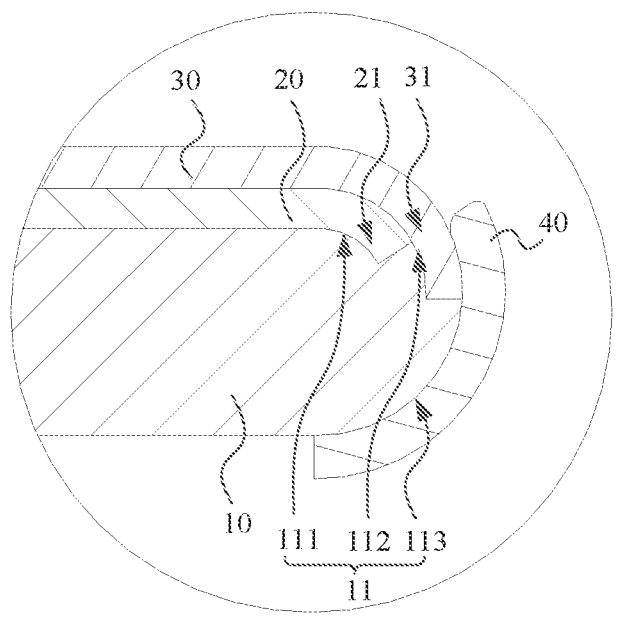
FIG. 9 is a first partial enlarged view of B in FIG. 5.

FIG. 9 is a first partial enlarged view of B in FIG. 5. Refer to FIG. 9. A projection of an end portion of the first extending part 21 onto the second extending part 31 abuts against a projection of an end portion of the rigid cover plate 40 onto the second extending part 31. In this implementation, the rigid cover plate 40 does not block the first extending part 21 of the flexible display 20. The rigid cover plate 40 tightly presses the flexible cover plate 30, and the flexible cover plate 30 tightly presses the flexible display 20, to prevent the first extending part 21 of the flexible display 20 from hunching up or detaching from the supporting part. In this case, a part that is of the first extending part 21 of the flexible display 20 and that is exposed outside through the flexible cover plate 30 is a complete arc surface display, thereby improving user experience.

Figure 10:
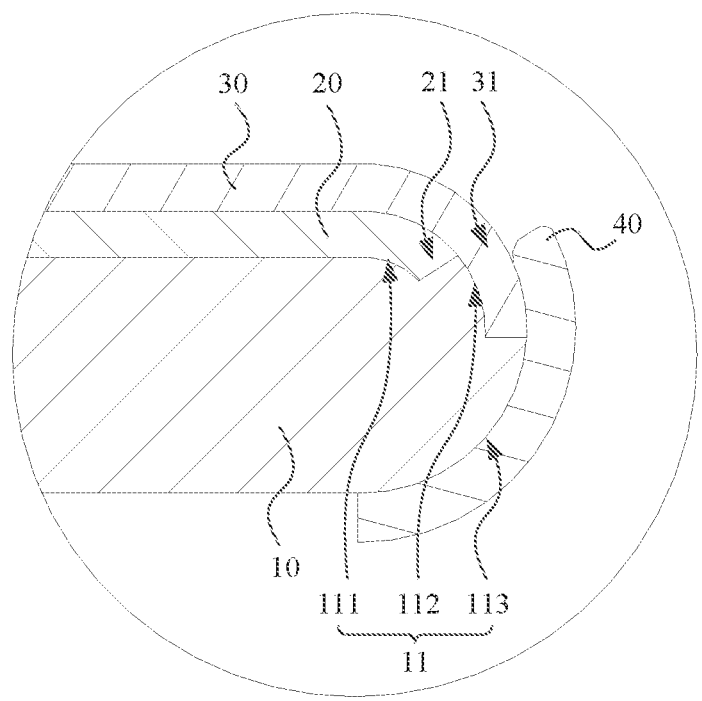
FIG. 10 is a second partial enlarged view of B in FIG. 5.

FIG. 10 is a second partial enlarged view of B in FIG. 5. Refer to FIG. 10. A projection of an end portion of the first extending part 21 onto the second extending part 31 is spaced apart from a projection of an end portion of the rigid cover plate 40 onto the second extending part 31. Optionally, the spacing may be in a range of 0 millimeters to 2 millimeters. Based on the same principle as that in the embodiment in FIG. 9, the rigid cover plate 40 does not block the first extending part 21 of the flexible display 20. The rigid cover plate 40 tightly presses the flexible cover plate 30, and the flexible cover plate 30 tightly presses the flexible display 20, to prevent the first extending part 21 of the flexible display 20 from hunching up or detaching from the supporting part. In this case, when the first extending part 21 of the flexible display 20 performs arc surface display through the flexible cover plate 30, a user can see a boundary of the flexible display 20.

Optionally, an opaque frame is disposed at a location corresponding to the foregoing spacing on the flexible cover plate 30, to block the boundary of the flexible display 20. Therefore, the user cannot see the boundary of the flexible display 20. This ensures aesthetic appearance of the electronic device and improves user experience.

Figure 11:
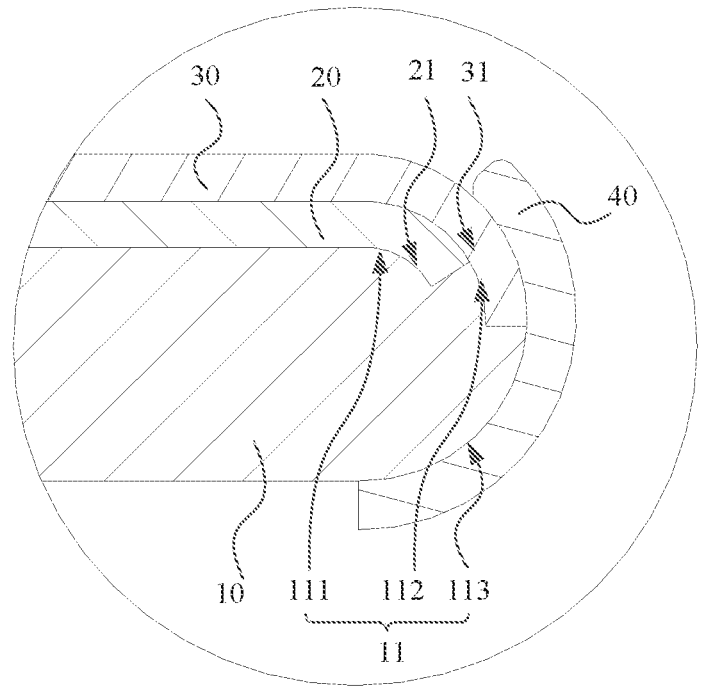
FIG. 11 is a third partial enlarged view of B in FIG. 5.

FIG. 11 is a third partial enlarged view of B in FIG. 5. Refer to FIG. 11. An area of a projection of the first extending part 21 onto the second extending part 31 is less than an area of a projection of the rigid cover plate 40 onto the second extending part 31. To be specific, the projection of the first extending part 21 onto the second extending part 31 partially overlaps the projection of the rigid cover plate 40 onto the second extending part 31. Optionally, a length of the overlapping region may be in a range of 1 millimeter to 3 millimeters. To be specific, a distance between an edge of the projection of the first extending part 21 onto the second extending part 31 and an edge of the projection of the rigid cover plate 40 onto the second extending part 31 is in a range of 1 millimeter to 3 millimeters. When the second extending part 31 has an overlapping part with the rigid cover plate 40, a compression effect of the rigid cover plate 40 can directly act on the flexible display 20 by using the flexible cover plate 30, to enhance the compression effect of the rigid cover plate 40 on the second extending part 31 of the flexible display 20. In addition, when the first extending part 21 of the flexible display 20 performs arc surface display through the flexible cover plate 30, a user does not see a boundary of the flexible display 20, so that the electronic device is more aesthetic, and user experience is improved.

Figure 12:
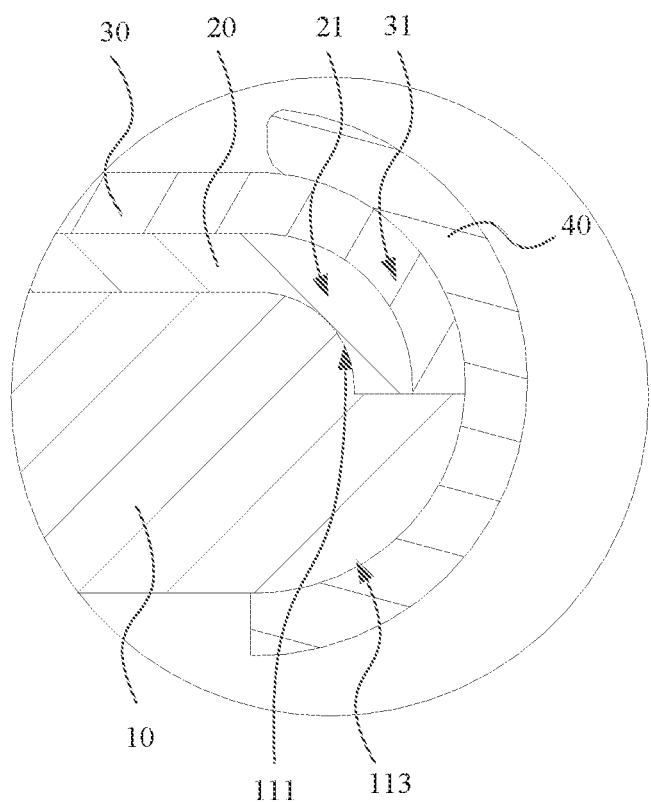
FIG. 12 is a partial enlarged view of E in FIG. 6.

FIG. 12 is a partial enlarged view of E in FIG. 6. Refer to FIG. 12. An area of a projection of the first extending part 21 onto the second extending part 31 is equal to an area of a projection of the rigid cover plate 40 onto the second extending part 31. To be specific, the projection of the first extending part 21 onto the second extending part 31 overlaps the projection of the rigid cover plate 40 onto the second extending part 31. When the second extending part 31 overlaps the rigid cover plate 40, a compression effect of the rigid cover plate 40 can directly act on the flexible display 20 by using the flexible cover plate 30, to enhance the compression effect of the rigid cover plate 40 on the second extending part 31 of the flexible display 20. Still refer to FIG. 5. The following describes an assembling process of the display assembly provided in the foregoing embodiment. The assembling process of the display assembly mainly includes three steps: step 1: Attach the flexible cover plate 30 to the flexible display 20, to obtain the screen assembly 50; step 2: Fix the screen assembly 50 to the supporting member 10; and step 3: Fix the rigid cover plate 40 to the supporting member 10. The following separately describes the foregoing three steps in detail.

Step 1: Attach the flexible cover plate 30 to the flexible display 20, to obtain the screen assembly 50.

Still refer to FIG. 5. The flexible cover plate 30 may be attached and bonded to the flexible display 20 first, and the second extending part 31 covers the first extending part 21, to obtain the integrated screen assembly 50. To be specific, the inner surface of the flexible cover plate 30 is attached and bonded to the outer surface of the flexible display 20, and the inner surface of the second extending part 31 covers the outer surface of the first extending part 21.

The flexible cover plate 30 may be adhesively attached to the flexible display 20 in a roller-type attaching manner, a vacuum attaching manner, or another attaching manner. The adhesive used may be, for example, an optically clear adhesive (optically clear adhesive, OCA). The OAC has features such as being colorless and transparent, and can ensure that the flexible display 20 performs display through the flexible cover plate 30, and a display effect is ensured.

Step 2: Fix the screen assembly 50 to the supporting member 10.

The first extending part 21, or a part of the first extending part 21 and a part of the second extending part 31 in the screen assembly 50 may be respectively bonded to the first side surface 111 and the second side surface 112 of the supporting member 10 in a manner of dispensing or backing. In the mounting process, for example, positioning may be completed in a charge-coupled device (charge-coupled device, CCD)-based positioning manner, that is, it is ensured that the screen assembly 50 is mounted on the supporting member 10. Positioning manners of the screen assembly 50 and the supporting member 10 are not particularly limited in this embodiment.

Step 3: Fix the rigid cover plate 40 to the supporting member 10.

The rigid cover plate 40 may be fixed to the supporting member 10 in a plurality of implementations. For example, fixation is performed in manners such as bonding, fastening, and bolting. The following provides detailed description with reference to figures.

Figure 13:
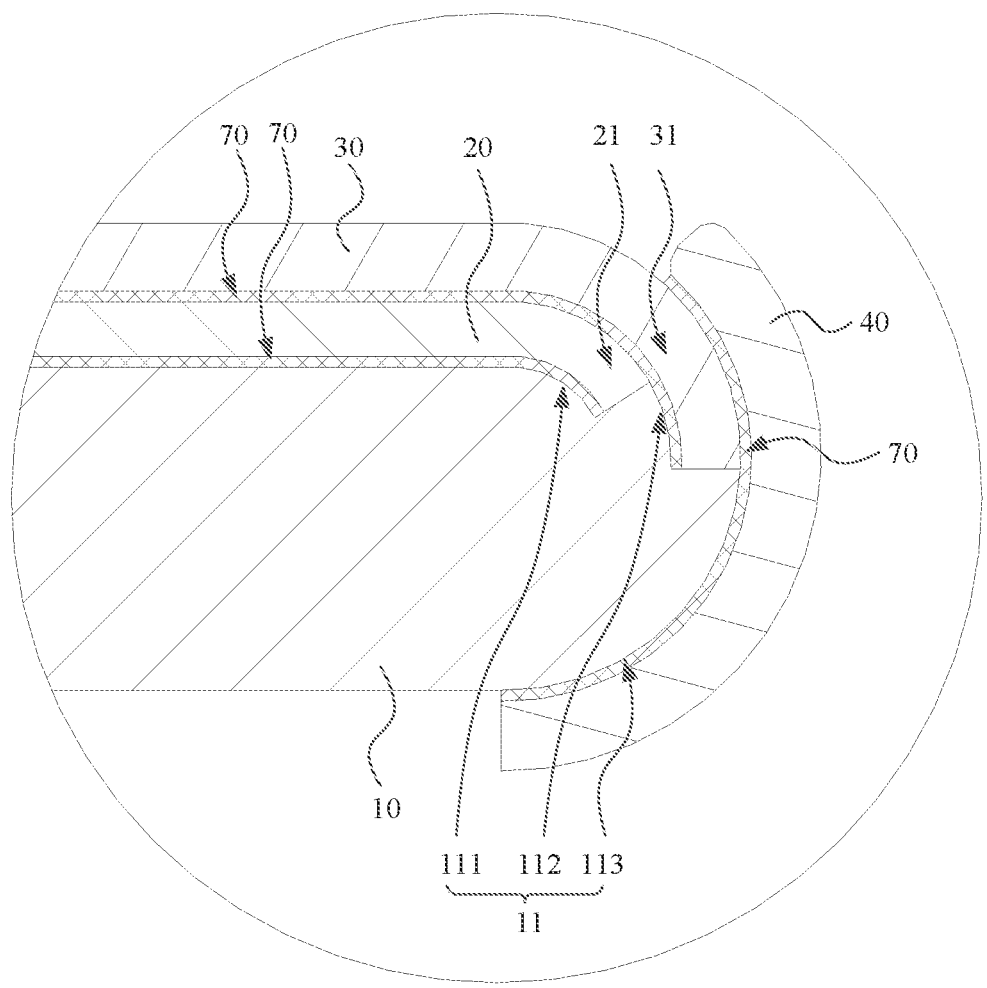
FIG. 13 is a fourth partial enlarged view of B in FIG. 5.

FIG. 13 is a fourth partial enlarged view of B in FIG. 5. Refer to FIG. 13. The rigid cover plate 40 is bonded to the supporting member 10 in an adhesive manner. For example, bonding may be performed in a manner of dispensing or backing. When the rigid cover plate 40 is fixed in the bonding manner, the rigid cover plate 40 is not only bonded to the supporting member 10, but also bonded to the flexible cover plate 30, to form an adhesive layer 60 shown in FIG. 13 through bonding.

When the rigid cover plate 40 is fixed to the supporting member 10 in the adhesive manner, a material of the rigid cover plate 40 may be a metal material, a plastic material, a glass material, a ceramic material, or the like. A strength of backing or dispensing may be increased in manners such as increasing surface roughness of the inner surface of the rigid cover plate 40 and selecting a dispensing or backing material with relatively strong viscosity. The inner surface of the rigid cover plate 40 may be sandblasted or roughened to increase the surface roughness of the inner surface of the rigid cover plate 40.

In some implementations, the rigid cover plate 40 may alternatively be fixed to the supporting member 10 by using a physical mechanical connection. For example, a first connecting part is disposed on the rigid cover plate 40, and a second connecting part matching the first connecting part is disposed on the supporting member 10, so that the rigid cover plate 40 is fixed to the supporting member 10 by using a matching connection between the first connecting part and the second connecting part. The physical mechanical connection may be a fixed connection, or may be a detachable connection, and an implementation of the connection is not particularly limited in this embodiment.

To ensure that the rigid cover plate 40 bears even force and ensure a fixation effect of the rigid cover plate 40, two or more first connecting parts may be evenly disposed in an extending direction of the rigid cover plate 40. Correspondingly, two or more second connecting parts are evenly disposed at opposite locations on the supporting member 10.

In a specific implementation process, the first connecting part may be connected to the second connecting part in an adhesive manner, or may be connected in a physical mechanical connection manner, or a physical mechanical connection may be added on the basis of the adhesive manner. By adding the physical mechanical connection, fixation reliability of the rigid cover plate 40 can be enhanced, and the effective compression effect of the rigid cover plate 40 on the flexible cover plate 30 can be ensured.

Figure 14:
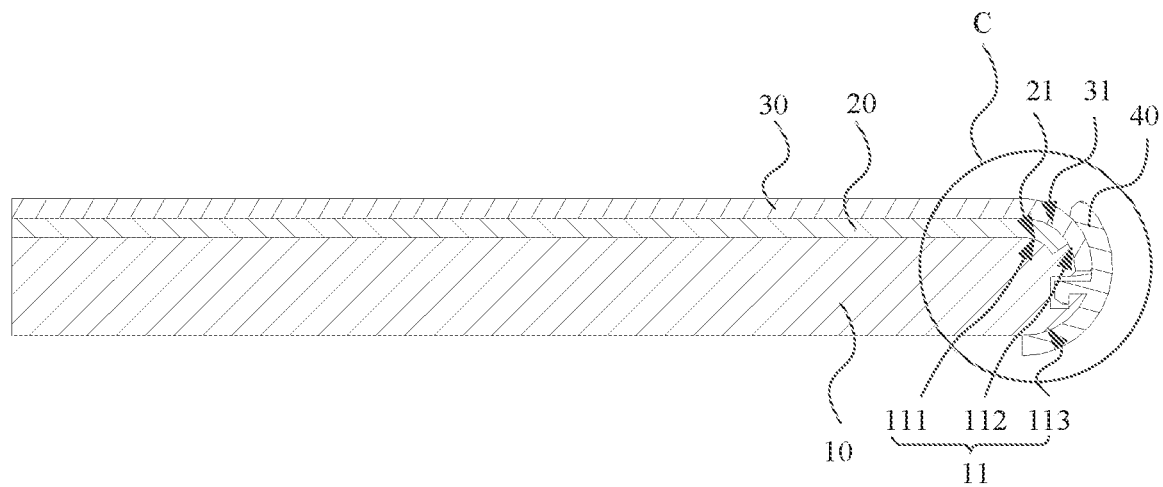
FIG. 14 is a third cross-sectional diagram along A-A in FIG. 4.
Figure 15:
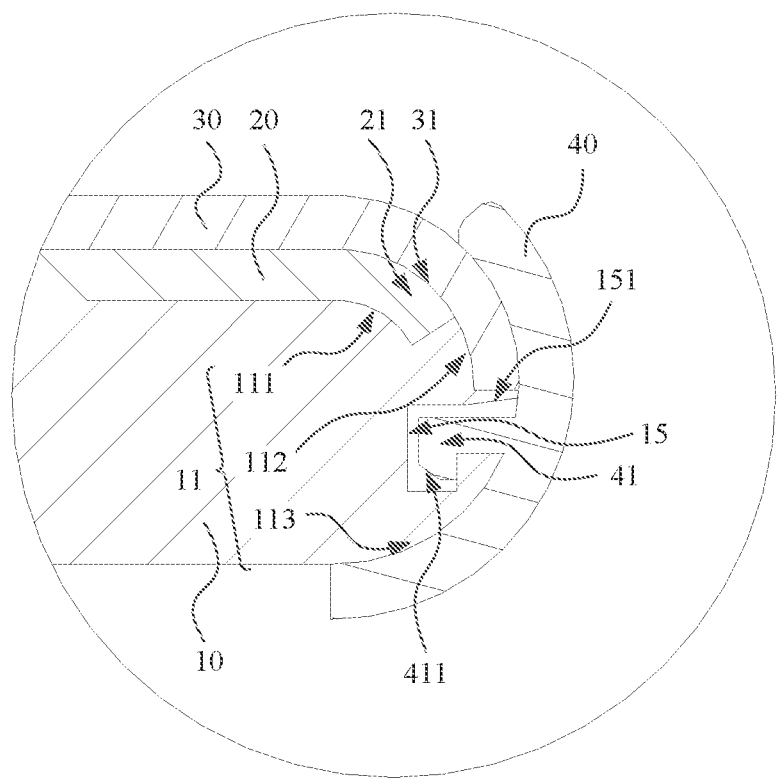
FIG. 15 is a partial enlarged view of C in FIG. 14.
Figure 16:
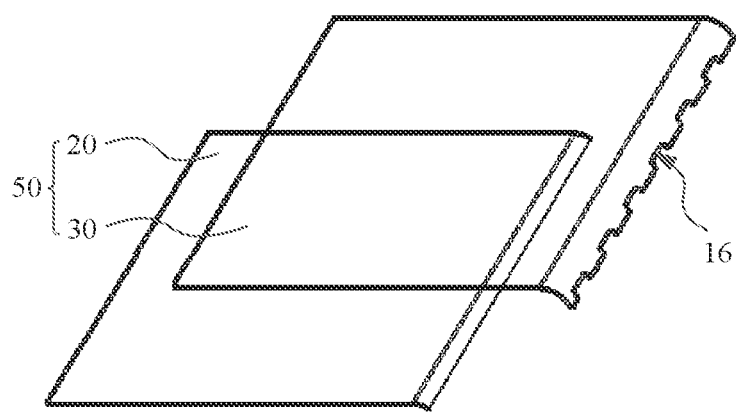
FIG. 16 is an exploded view of a second screen assembly in a display assembly according to an embodiment of this application.
Figure 17:
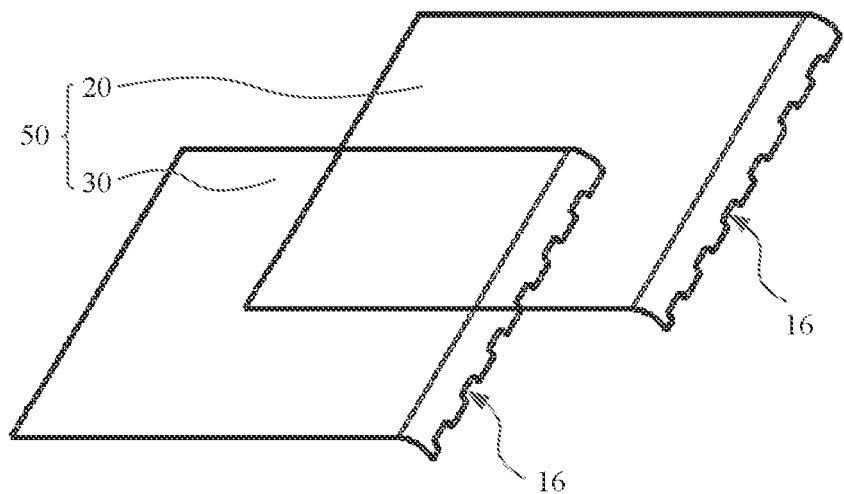
FIG. 17 is an exploded view of a third screen assembly in a display assembly according to an embodiment of this application.

FIG. 14 is a third cross-sectional diagram along A-A in FIG. 4; FIG. 15 is a partial enlarged view of C in FIG. 14; FIG. 16 is an exploded view of a second screen assembly in a display assembly according to an embodiment of this application; and FIG. 17 is an exploded view of a third screen assembly in a display assembly according to an embodiment of this application. Refer to FIG. 14 to FIG. 17. The rigid cover plate 40 may be fixed to the supporting member 10 in a fastening manner. Specifically, the foregoing first connecting structure may be a first clamping part 41 disposed on the inner surface of the rigid cover plate 40. The foregoing second connecting structure may be a second clamping part 15 disposed on the supporting member 10. The first clamping part 41 is clamped with the second clamping part 15. The rigid cover plate 40 is fixed to the supporting member 10 in a clamping manner.

The first clamping part 41 may be a structure that is used for clamping and that protrudes from the inner surface of the rigid cover plate 40, for example, a structure such as a clamping hook, a clamping sheet, a clamping post, or a fastener, and the second clamping part 15 is a structure used for clamping the first clamping part 41, such as a clamping slot, a clamping ring, or a clamping lock.

In the schematic structures shown in FIG. 14 and FIG. 15, the first clamping part 41 is a clamping hook, the second clamping part 15 is a clamping slot, and the clamping hook is clamped with the clamping slot. The clamping slot has a guide bevel 151. The guide bevel 151 is inclined toward inside of the clamping slot. In a process of pushing the clamping hook into the clamping slot, the guide bevel 151 provides guidance for the clamping hook, to facilitate the clamping hook to be clamped into the clamping slot. A chamfer 411 is disposed on one end of the clamping hook that is far away from the rigid cover plate 40, and the chamfer 411 has a guiding effect, to facilitate the clamping hook to be clamped into the clamping slot.

Refer to FIG. 16. When the second extending part 31 of the flexible cover plate 30 blocks the second clamping part 15, and the first extending part 21 of the flexible display 20 does not block the second clamping part 15, an avoidance slot 16 is provided in the second extending part 31 of the flexible cover plate 30, to prevent the second extending part 31 of the flexible cover plate 30 from interfering with the second clamping part 15 or the first clamping part 41.

Refer to FIG. 17. The screen assembly 50 includes a flexible display 20 and a flexible cover plate 30 covering the flexible display 20. When both the second extending part 31 of the flexible cover plate 30 and the first extending part 21 of the flexible display 20 cover the second clamping part 15, avoidance slots 16 are provided at both opposite locations of the second extending part 31 of the flexible cover plate 30 and the first extending part 21 of the flexible display 20, to prevent the screen assembly 50 from interfering with the second clamping part 15 or the first clamping part 41.

When the first clamping part 41 is disposed on the rigid cover plate 40, the rigid cover plate 40 may be made of a plastic material, and the first clamping part 41 and the rigid cover plate 40 are integrally formed through injection molding, to reduce costs. The rigid cover plate 40 may alternatively be made of a metal material, and the rigid cover plate 40 has higher strength, has a metallic luster surface, and is better in hand feelings and appearance.

In this embodiment, the first clamping part 41 is disposed on the rigid cover plate 40, and the second clamping part 15 matching the first clamping part 41 is disposed on the supporting member 10. The rigid cover plate 40 is fixed to the supporting member 10 through cooperation between the first clamping part 41 and the second clamping part 15, and the rigid cover plate 40 presses the first extending part 21 of the flexible display 20 on the connecting edge 11 of the supporting member 10 by using the second extending part 31 of the flexible cover plate 30, to ensure flatness and fixation strength of the flexible display 20 in the arc surface region. In addition, fixation is performed in a clamping manner, it is convenient for detachment, reuse can be facilitated, and it is convenient to maintain the electronic device.

Figure 18:
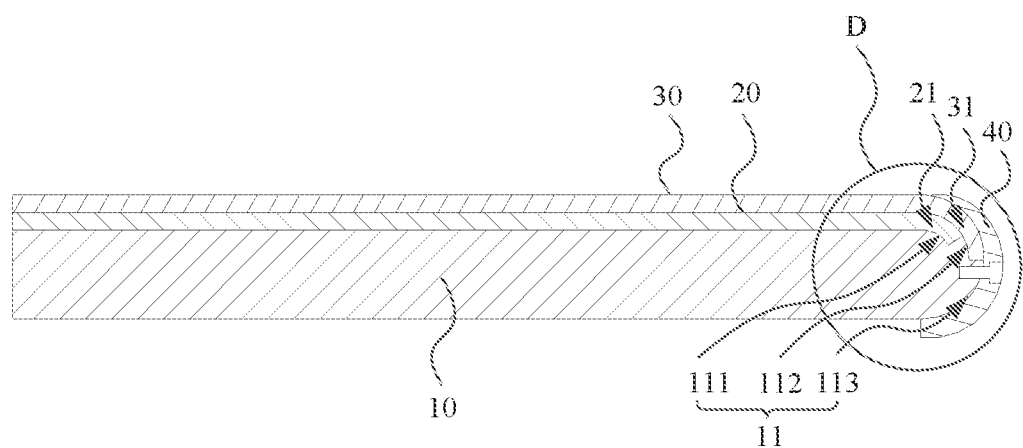
FIG. 18 is a fourth cross-sectional diagram along A-A in FIG. 4.
Figure 19:
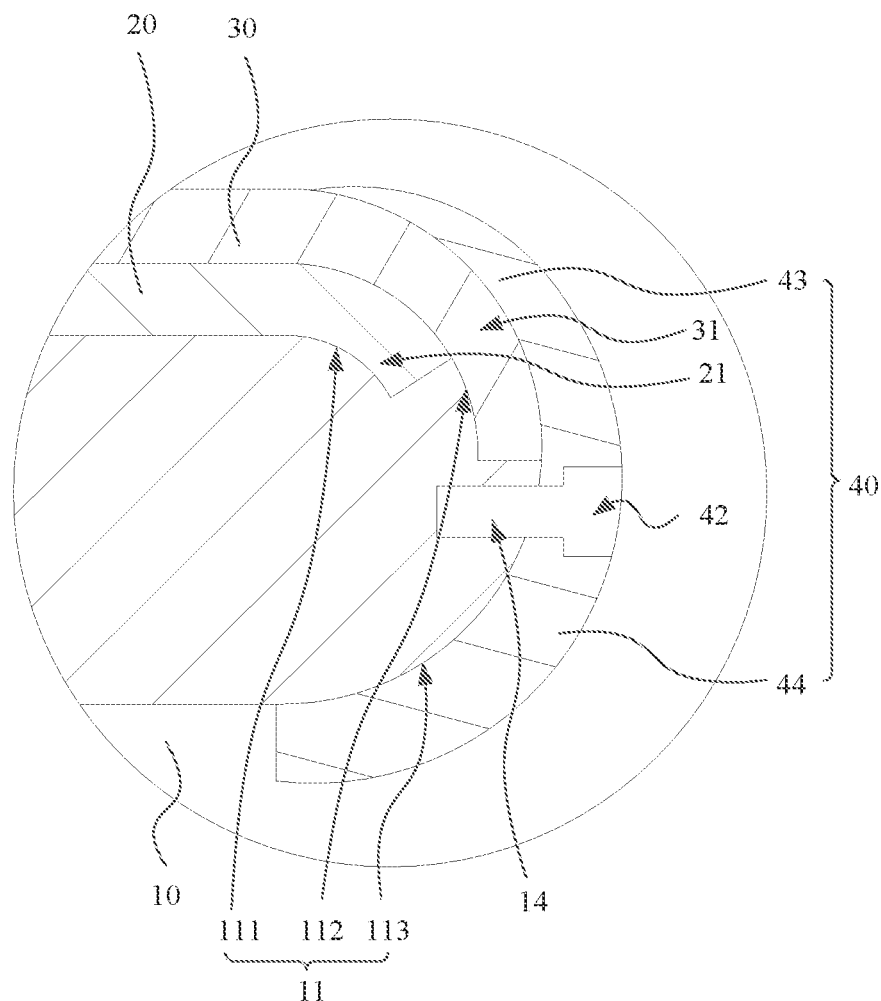
FIG. 19 is a partial enlarged view of D in FIG. 18.

FIG. 18 is a fourth cross-sectional diagram along A-A in FIG. 4; and FIG. 19 is a partial enlarged view of D in FIG. 18. Refer to FIG. 18 and FIG. 19. The rigid cover plate 40 may be connected to the supporting member 10 in a manner of connection by using a screw.

Specifically, the foregoing first connecting structure may be a first connecting hole 42 provided in the rigid cover plate 40, the foregoing second connecting structure may be a second connecting hole 14 provided in the supporting member 10, the first connecting hole 42 is opposite to the second connecting hole 14, and the first connecting hole 42 is connected to the second connecting hole 14 by using a screw.

Optionally, the first connecting hole 42 is a counterbore (or may be referred to as a step hole), and the first connecting hole 42 is a cylindrical counterbore or a conical counterbore. A head of a screw is sunk into a step hole of a part, to ensure aesthetic appearance of the electronic device.

The rigid cover plate 40 may be formed through injection molding using plastic, or may be molded by using metal and a CNC process. The CNC process is computer numerical controlled precision machining, and the CNC process facilitates machining of the first connecting hole 42 and the second connecting hole 14 with high machining precision. In addition, the rigid cover plate 40 is made of a brittle material such as glass or ceramic. It is difficult for the brittle material to be used for a clamping structure, but the brittle material may be used for a screw structure.

The rigid cover plate 40 is fixed to the supporting member 10 by using screws, so that fixation strength is higher, and the rigid cover plate 40 is not easily loosened and detached. In addition, pressing force of the rigid cover plate 40 on the flexible display 20 may be further controlled by using fastening force of the screw, to ensure that the flexible display 20 is pressed tight and flat.

Still refer to FIG. 18 and FIG. 19. A thickness of the rigid cover plate 40 may gradually decrease, and a thickness of an end portion of the rigid cover plate 40 facing toward the flexible cover plate 30 is smallest. The end portion of the rigid cover plate 40 facing toward the flexible cover plate 30 performs transition with the flexible cover plate 30 in a manner of an arc surface. On the basis of ensuring that the first extending part 21 of the flexible display 20 exposes the arc surface screen outside through the flexible cover plate 30, smooth appearance and good hand holding feelings of the electronic device can be ensured. The rigid cover plate 40 includes at least a first cover plate section 43 and a second cover plate section 44, the first cover plate section 43 covers at least one part of the second extending part 31, the second cover plate section 44 covers at least one part of the supporting member 10, and a thickness of the first cover plate section 43 is less than that of the second cover plate section 44.

Figure 20:
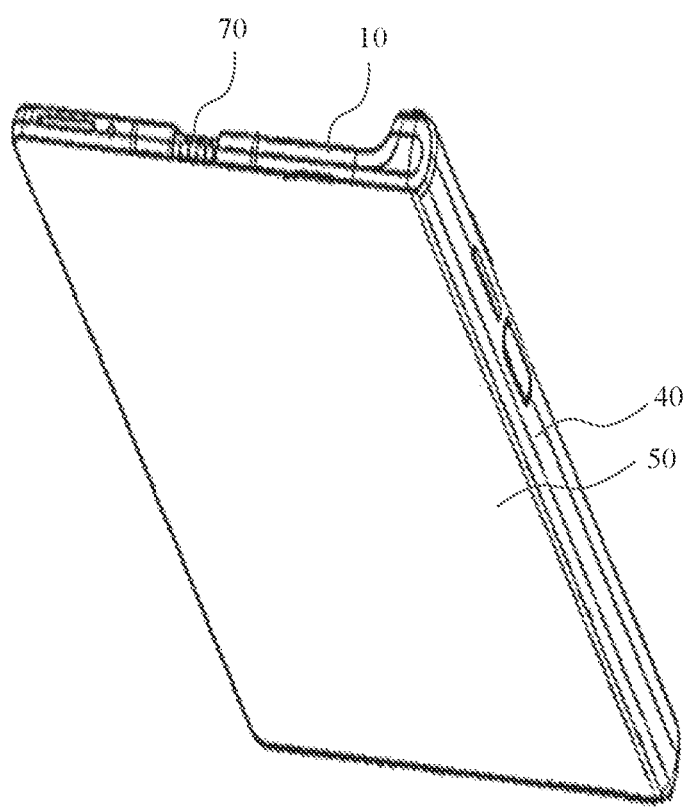
FIG. 20 is a schematic diagram of a structure of a state of an electronic device according to an embodiment of this application.
Figure 21:
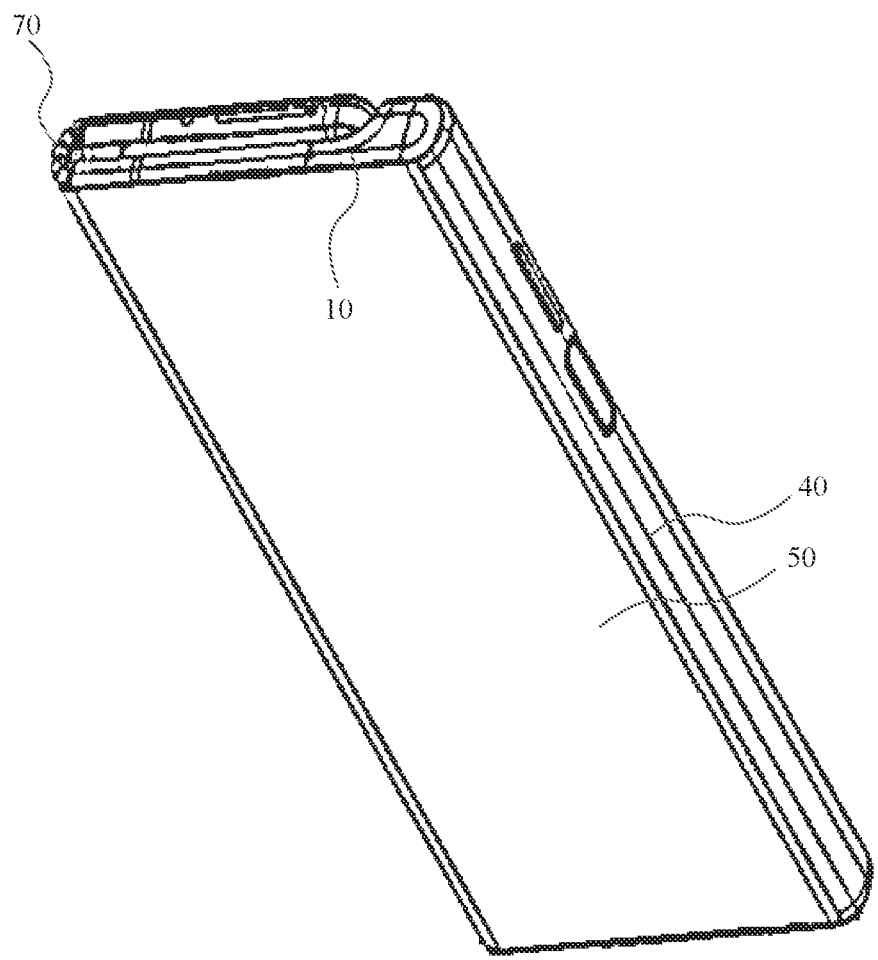
FIG. 21 is a schematic diagram of a structure of another state of an electronic device according to an embodiment of this application.

FIG. 20 is a schematic diagram of a structure of a state of an electronic device according to an embodiment of this application; and FIG. 21 is a schematic diagram of a structure of another state of an electronic device according to an embodiment of this application. As shown in FIG. 20 and FIG. 21, the electronic device includes the display assembly provided in the foregoing embodiment.

A specific structure, a function, and a working principle of the display assembly have been described in detail in the foregoing embodiment, and details are not described herein again.

The electronic device may be a smartphone, a notebook computer, a tablet computer, a smartwatch, an ebook, a virtual reality (Virtual Reality, VR) device, an augmented reality (Augmented Reality, AR) device, or a mixed reality (Mixed Reality, MR). Details are not described herein again in this embodiment.

In addition, the electronic device may further include structures such as a circuit board and a power switch.

Still refer to FIG. 20 and FIG. 21. The display assembly includes a supporting member 10, a screen assembly 50 disposed on the supporting member 10, a rigid cover plate 40, and a rotating shaft 70. The screen assembly 50 includes a flexible display 20 and a flexible cover plate 30 covering the flexible display 20. The flexible display 20 is located on the supporting member 10.

Because the screen assembly 50 includes the flexible display 20 and the flexible cover plate 30, and both the flexible display 20 and the flexible cover plate 30 are bendable and flexible, the electronic device is foldable in a rotating process of the rotating shaft 70. Refer to FIG. 21. Under an action of the rotating shaft 70, the electronic device is in a folded state. In this case, a middle part of the screen assembly 50 is in a bent state, and a size of the electronic device becomes smaller, making it convenient for a user to carry.

It should be noted that, FIG. 20 and FIG. 21 are merely examples, and the electronic device in this application is not limited to a foldable electronic device.

A structure of the rotating shaft 70 is not particularly limited in this embodiment, provided that the rotating shaft 70 can enable the electronic device to be folded.

Still refer to FIG. 3, FIG. 5, and FIG. 20. In this embodiment, the second extending part 31 covers the first extending part 21, that is, the second extending part 31 can press the first extending part 21, the rigid cover plate 40 covers the first side surface 111 of the supporting member 10, and the rigid cover plate 40 covers at least one part of the second extending part 31, that is, the rigid cover plate 40 is connected to the supporting member 10 and can press the second extending part 31. In this way, when the electronic device is in a folded, bent, or another state, reverse elastic force generated by the first extending part 21 of the flexible display 20 is counteracted by the rigid cover plate 40 by using the second extending part 31, to prevent the screen assembly 50 from detaching from the supporting part due to tension of the flexible display 20. When the first extending part 21 of the flexible display 20 is attached to the connecting edge 11 that is in a bent state, the first extending part 21 of the flexible display 20 is protected, to prevent the flexible display 20 from hunching up due to a reason such as bending or folding.

What is claimed is:

1. A display assembly comprising:
   a screen assembly comprising:
      a flexible display comprising a first edge, wherein the first edge comprises a first extending part comprising:
         a first outer surface that is arc-shaped; and
         a first inner surface that is arc-shaped; and
      a flexible cover plate covering the flexible display and comprising a second edge, wherein the second edge comprises a second extending part covering the first extending part and comprising:
         a second inner surface that is arc-shaped, wherein the first outer surface matches at least one part of the second inner surface; and
         a second outer surface that is arc-shaped;
   a supporting member configured to support the flexible display and comprising a third edge, wherein the third edge comprises:
      a first side surface that is arc-shaped, wherein the first side surface matches the first inner surface, and wherein the first extending part covers the first side surface;
      a second side surface that is arc-shaped, wherein the second side surface matches the second inner surface, wherein the second extending part covers the second side surface, and wherein the first side surface is offset from the second side surface; and
      a third side surface that is arc-shaped; and
   a rigid cover plate comprising a third inner surface, wherein a first part of the third inner surface is arc-shaped and matches at least one part of the third side surface, wherein a second part of the third inner surface is arc-shaped and matches at least one part of the second outer surface.

2. The display assembly of claim 1, wherein a first projection of the first extending part in a Z-axis direction is a first size, wherein a second projection of the second extending part in the Z-axis direction is a second size, and wherein the first size is greater than the second size.

3. The display assembly of claim 1, wherein a first projection of a first end of the first extending part onto the second extending part abuts against a second projection of a second end of the rigid cover plate onto the second extending part.

4. The display assembly of claim 1, wherein a first projection of the first extending part onto the second extending part partially overlaps a second projection of the rigid cover plate onto the second extending part.

5. The display assembly of claim 1, wherein a contact surface between the rigid cover plate and the supporting member is arc-shaped.

6. The display assembly of claim 1, wherein the rigid cover plate is fixed relative to both the second extending part and the third side surface.

7. The display assembly of claim 1, wherein the supporting member further comprises a first stepped surface, and wherein the first stepped surface is coupled to the first side surface and the second side surface.

8. The display assembly of claim 7, wherein a width of the first stepped surface is substantially the same as a thickness of the first extending part.

9. The display assembly of claim 7, wherein the first stepped surface matches an end surface of the first extending part.

10. The display assembly of claim 7, wherein the supporting member further comprises a second stepped surface, and wherein the second stepped surface is coupled to the second side surface and the third side surface.

11. The display assembly of claim 10, wherein a width of the second stepped surface matches a thickness of the second extending part.

12. The display assembly of claim 10, wherein the second stepped surface matches an end surface of the second extending part.

13. The display assembly of claim 1, wherein the supporting member further comprises a first stepped surface, wherein at least one first part of the first stepped surface matches a first end surface of the first extending part, wherein at least one second part of the first stepped surface matches a second end surface of the second extending part, and wherein a width of the first stepped surface is equal to a sum of a thickness of the first extending part and a thickness of the second extending part.

14. The display assembly of claim 1, wherein the rigid cover plate comprises:
    a first cover plate section covering the at least one part of the second extending part; and
    a second cover plate section covering the at least one part of the supporting member, wherein a first thickness of the first cover plate section is less than a second thickness of the second cover plate section.

15. The display assembly of claim 1, wherein the supporting member further comprises a clamping slot comprising a hook-shaped cavity within an interior portion of the supporting member, wherein the rigid cover plate comprises a clamping hook disposed on the third inner surface and protruding away from the third inner surface, wherein the clamping hook is configured to fit within the clamping slot and secure the rigid cover plate to the supporting member, wherein the clamping hook comprises a U-shaped inner surface, wherein the clamping slot further comprises a ridge forming the hook-shaped cavity, and wherein the ridge is configured to be enclosed on three sides by the U-shaped inner surface.

16. An electronic device comprising:
    a circuit board; and
    a display assembly coupled to the circuit board and comprising:
        a screen assembly comprising:
            a flexible display comprising a first edge, wherein the first edge comprises a first extending part comprising:
                a first outer surface that is arc-shaped; and
                a first inner surface that is arc-shaped; and
            a flexible cover plate covering the flexible display and comprising a second edge, wherein the second edge comprises a second extending part covering the first extending part and comprising:
                a second inner surface that is arc-shaped, wherein the first outer surface matches at least one part of the second inner surface; and
                a second outer surface that is arc-shaped;
        a supporting member configured to support the flexible display and comprising a third edge, wherein the third edge comprises:
            a first side surface that is arc-shaped, wherein the first side surface matches the first inner surface, and wherein the first extending part covers the first side surface;
            a second side surface that is arc-shaped, wherein the second side surface matches the second inner surface, wherein the second extending part covers the second side surface, and wherein the first side surface is offset from the second side surface; and
            a third side surface that is arc-shaped; and
        a rigid cover plate comprising a third inner surface, wherein a first part of the third inner surface is arc-shaped and matches at least one part of the third side surface, wherein a second part of the third inner surface is arc-shaped and matches at least one part of the second outer surface.

17. An apparatus, comprising:
    a screen assembly comprising:
        a flexible display comprising a first edge, wherein the first edge comprises a first extending part comprising:
            a first outer surface; and
            a first inner surface; and
        a flexible cover plate covering the flexible display and comprising a second edge, wherein the second edge comprises a second extending part covering the first extending part and comprising:
            a second inner surface, wherein the first outer surface matches at least one part of the second inner surface; and
            a second outer surface that is arc-shaped;
    a supporting member configured to support the flexible display and comprising a third edge, wherein the third edge comprises:
        a first side surface that is arc-shaped, wherein the first side surface matches the first inner surface, and wherein the first extending part covers the first side surface;
        a second side surface that is arc-shaped, wherein the second side surface matches the second inner surface, wherein the second extending part covers the second side surface, and wherein the first side surface is offset from the second side surface; and
        a third side surface that is arc-shaped; and
    a rigid cover plate comprising a third inner surface, wherein a first part of the third inner surface is arc-shaped and matches at least one part of the third side surface, wherein a second part of the third inner surface is arc-shaped and matches at least one part of the second outer surface.

18. The apparatus of claim 17, wherein the supporting member further comprises a first stepped surface, and wherein the first stepped surface is coupled to the first side surface and the second side surface.

19. The apparatus of claim 18, wherein a width of the first stepped surface is substantially the same as a thickness of the first extending part.

20. The apparatus of claim 18, wherein the first stepped surface matches an end surface of the first extending part.

* * * * *